(12) United States Patent (10) Patent No.: US 8,890,165 B2
Lee et al. (45) Date of Patent: Nov. 18, 2014

(54) METHOD OF FORMING POLYCRYSTALLINE SILICON LAYER, THIN FILM TRANSISTOR, ORGANIC LIGHT EMITTING DIODE DISPLAY DEVICE HAVING THE SAME, AND METHODS OF FABRICATING THE SAME

(75) Inventors: Dong-Hyun Lee, Yongin (KR); Ki-Yong Lee, Yongin (KR); Jin-Wook Seo, Yongin (KR); Tae-Hoon Yang, Yongin (KR); Maxim Lisachenko, Yongin (KR); Byoung-Keon Park, Yongin (KR); Kil-Won Lee, Yongin (KR); Jae-Wan Jung, Yongin (KR)

(73) Assignee: Samsung Display Co., Ltd., Yongin (KR)

( * ) Notice: Subject to any disclaimer, the term of this patent is extended or adjusted under 35 U.S.C. 154(b) by 34 days.

(21) Appl. No.: 12/714,154

(22) Filed: Feb. 26, 2010

(65) Prior Publication Data

US 2011/0114961 A1 May 19, 2011

(30) Foreign Application Priority Data

Nov. 13, 2009 (KR) ........................ 10-2009-0109835

(51) Int. Cl.
| | |
|---|---|
| H01L 29/04 | (2006.01) |
| H01L 27/12 | (2006.01) |
| H01L 29/786 | (2006.01) |
| H01L 21/02 | (2006.01) |
| H01L 29/66 | (2006.01) |

(52) U.S. Cl.
CPC ...... *H01L 29/78675* (2013.01); *H01L 27/1277* (2013.01); *H01L 27/1285* (2013.01); *H01L 29/78696* (2013.01); *H01L 27/1296* (2013.01); *H01L 21/02672* (2013.01); *H01L 29/66757* (2013.01); *H01L 27/1281* (2013.01); *H01L 21/02532* (2013.01)
USPC ............................... 257/72; 257/40; 257/347

(58) Field of Classification Search
CPC .................. H01L 29/66757; H01L 29/78696; H01L 29/78675
USPC ........................ 257/40, 59, 72, 347
See application file for complete search history.

(56) References Cited

U.S. PATENT DOCUMENTS

| | | | |
|---|---|---|---|
| 5,517,037 | A | 5/1996 | Yamamoto |
| 5,814,540 | A | 9/1998 | Takemura et al. |

(Continued)

FOREIGN PATENT DOCUMENTS

| | | |
|---|---|---|
| CN | 1779985 | 5/2006 |
| EP | 0763765 | 3/1997 |

(Continued)

OTHER PUBLICATIONS

S.L. Gras, et al., Intelligent Control of Surface Hydrophobicity, pp. 2036-2050, ChemphyChem, vol. 8, Oct. 2007, Wiley-VCH, Germany.

(Continued)

*Primary Examiner* — Ori Nadav
(74) *Attorney, Agent, or Firm* — H.C. Park & Associates, PLC (57) ABSTRACT

A method of forming a polycrystalline silicon layer, a thin film transistor (TFT), an organic light emitting diode (OLED) display device having the same, and methods of fabricating the same. The method of forming a polycrystalline silicon layer includes providing a substrate, forming a buffer layer on the substrate, forming an amorphous silicon layer on the buffer layer, forming a groove in the amorphous silicon layer, forming a capping layer on the amorphous silicon layer, forming a metal catalyst layer on the capping layer, and annealing the substrate and crystallizing the amorphous silicon layer into a polycrystalline silicon layer.

8 Claims, 7 Drawing Sheets

(56) References Cited

U.S. PATENT DOCUMENTS

| | | | |
|---|---|---|---|
| 5,818,083 | A | 10/1998 | Ito |
| 6,198,133 | B1 | 3/2001 | Yamazaki et al. |
| 6,294,442 | B1 | 9/2001 | Kamal |
| 6,294,815 | B1 | 9/2001 | Yamazaki et al. |
| 6,703,266 | B1 | 3/2004 | Chen et al. |
| 6,806,099 | B2 | 10/2004 | Takeda et al. |
| 6,812,473 | B1 | 11/2004 | Amemiya |
| 6,927,107 | B1 | 8/2005 | Makita et al. |
| 7,091,519 | B2 | 8/2006 | Yamazaki et al. |
| 7,341,907 | B2 | 3/2008 | Li et al. |
| 7,615,421 | B2 | 11/2009 | Lee et al. |
| 7,618,852 | B2 | 11/2009 | Jang et al. |
| 2001/0003659 | A1 | 6/2001 | Aya et al. |
| 2002/0063261 | A1 | 5/2002 | Zhang |
| 2003/0080337 | A1 | 5/2003 | Yudasaka et al. |
| 2004/0004597 | A1 | 1/2004 | Kung et al. |
| 2004/0115906 | A1 | 6/2004 | Makita et al. |
| 2004/0173796 | A1 | 9/2004 | Miyasaka |
| 2005/0023531 | A1 | 2/2005 | Shoji et al. |
| 2005/0161742 | A1 | 7/2005 | Isobe et al. |
| 2005/0184290 | A1 | 8/2005 | Ohnuma |
| 2005/0275019 | A1 | 12/2005 | Seo et al. |
| 2006/0040429 | A1 | 2/2006 | Park et al. |
| 2006/0051914 | A1 | 3/2006 | Kakehata et al. |
| 2006/0061266 | A1 | 3/2006 | Kang et al. |
| 2006/0121651 | A1 | 6/2006 | Park et al. |
| 2006/0130939 | A1 | 6/2006 | Jang et al. |
| 2007/0238229 | A1 | 10/2007 | Chang et al. |
| 2008/0111135 | A1 | 5/2008 | Choi et al. |
| 2008/0157083 | A1 | 7/2008 | Park et al. |
| 2008/0211024 | A1 | 9/2008 | Kato et al. |
| 2008/0258186 | A1 | 10/2008 | Surdeanu et al. |
| 2009/0050894 | A1 | 2/2009 | Park et al. |
| 2009/0239352 | A1 | 9/2009 | Kitagawa et al. |

FOREIGN PATENT DOCUMENTS

| | | |
|---|---|---|
| EP | 1903604 A2 | 3/2008 |
| EP | 2226833 A1 | 9/2010 |
| JP | 63-033868 | 2/1988 |
| JP | 63-304668 | 12/1988 |
| JP | 01-102525 | 4/1989 |
| JP | 05-173177 | 7/1993 |
| JP | 06-067203 | 3/1994 |
| JP | 06-260651 | 9/1994 |
| JP | 07-013196 | 1/1995 |
| JP | 08-045850 | 2/1996 |
| JP | 09-107100 | 4/1997 |
| JP | 2001-189275 | 7/2001 |
| JP | 2001-337348 | 12/2001 |
| JP | 2003-060209 | 2/2003 |
| JP | 2003-100629 | 4/2003 |
| JP | 2003-115457 | 4/2003 |
| JP | 2003-188098 | 7/2003 |
| JP | 2004-207298 | 7/2004 |
| JP | 2005-064487 | 3/2005 |
| JP | 2005-229096 | 8/2005 |
| JP | 2005-354028 | 12/2005 |
| JP | 2006-019682 | 1/2006 |
| JP | 2006-024881 | 1/2006 |
| JP | 2006-330736 | 12/2006 |
| JP | 2007-013145 | 1/2007 |
| JP | 2007-027202 | 2/2007 |
| JP | 2007-035812 | 2/2007 |
| JP | 2007-073953 | 3/2007 |
| JP | 2007-193313 | 8/2007 |
| JP | 2007-311767 | 11/2007 |
| JP | 2008-166698 | 7/2008 |
| JP | 2008-166703 | 7/2008 |
| JP | 2008-166785 | 7/2008 |
| JP | 2009-059940 | 3/2009 |
| KR | 1992-0006076 | 7/1992 |
| KR | 10-1997-0072491 | 7/1997 |
| KR | 10-1997-0063763 | 9/1997 |
| KR | 10-1997-0072491 | 11/1997 |
| KR | 10-2000-0055877 | 9/2000 |
| KR | 10-0285865 | 3/2001 |
| KR | 10-2001-0078788 | 8/2001 |
| KR | 10-0317638 | 12/2001 |
| KR | 10-2002-0021546 | 3/2002 |
| KR | 10-2003-0028696 | 4/2003 |
| KR | 10-2004-0035409 | 4/2004 |
| KR | 10-2004-0036761 | 5/2004 |
| KR | 10-2004-0040762 | 5/2004 |
| KR | 10-2004-0098958 | 11/2004 |
| KR | 10-0470274 | 2/2005 |
| KR | 10-2006-0018533 | 3/2006 |
| KR | 1020060058934 | 6/2006 |
| KR | 10-0623228 | 9/2006 |
| KR | 10-0628989 | 9/2006 |
| KR | 10-0772347 | 10/2007 |
| KR | 10-2007-0107142 | 11/2007 |
| KR | 10-2007-0107168 | 11/2007 |
| KR | 10-0778781 | 11/2007 |
| KR | 10-0839735 | 6/2008 |
| KR | 10-2008-0086967 | 9/2008 |
| TW | 361694 | 6/1999 |
| TW | I296855 | 5/2008 |
| TW | I305681 | 1/2009 |
| TW | I307961 | 3/2009 |

OTHER PUBLICATIONS

Ex Parte Quayle Action dated May 9, 2011 with regard to related U.S. Appl. No. 12/714,252.

English-language abstract of Japanese Patent Publication No. 11-02525.

Soo Young Yoon et al., "*Metal-induced crystallization of amorphous silicon*," Thin Solid Films 383 (2001), pp. 34-38.

Notice of Allowance of U.S. Appl. No. 12/714,252 issued on Aug. 30, 2011.

Non-Final Office Action of related U.S. Appl. No. 12/714,137 dated Dec. 19, 2011.

Non-Final Office Action of U.S. Appl. No. 12/714,201 dated on Jan. 13, 2012.

Final Office Action of U.S. Appl. No. 12/714,201 dated Jan. 17, 2013.

Non-Final Office Action of related U.S. Appl. No. 12/712,591 mailed on Feb. 28, 2013.

Non-Final Office Action of U.S. Appl. No. 12/713,928 dated on Mar. 28, 2012.

Final Office Action of U.S. Appl. No. 12/714,137 dated on Mar. 22, 2012.

Final Office Action of U.S. Appl. No. 12/714,201 dated on Apr. 24, 2012.

Notice of Allowance issued on May 24, 2013 in U.S. Appl. No. 13/177,936.

Final Office Action of U.S. Appl. No. 12/713,928 dated on Jul. 10, 2012.

Non-Final Office Action of related U.S. Appl. No. 12/713,846 issued Aug. 27, 2012.

Final Office Action of U.S. Appl. No. 12/713,928 dated Sep. 20, 2012.

Non-Final Office Action of U.S. Appl. No. 12/714,201 dated Sep. 27, 2012.

Notice of Allowance of U.S. Appl. No. 12/713,846 dated on Dec. 14, 2012.

Final Office Action issued on Jul. 24, 2013 in U.S. Appl. No. 12/712,591.

Non-Final Office Action dated Dec. 3, 2013 in U.S. Appl. No. 12/714,201.

Final Office Action issued on Mar. 12, 2014 in U.S. Appl. No. 12/714,201.

US Office Action dated Nov. 8, 2010, issued in corresponding U.S. Appl. No. 12/714,252.

U.S. Appl. No. 12/714,201, filed Feb. 26, 2010, Byoung-keon Park et al., Samsung Mobile Display Co., Ltd.

U.S. Appl. No. 12/713,846, filed Feb. 26, 2010, Byoung-keon Park et al., Samsung Mobile Display Co., Ltd.

(56) References Cited

OTHER PUBLICATIONS

U.S. Appl. No. 12/712,591, filed Feb. 25, 2010, Dong-hyun Lee et al., Samsung Mobile Display Co., Ltd.
U.S. Appl. No. 12/714,252, filed Feb. 26, 2010, Yun-mo Chung et al., Samsung Mobile Display Co., Ltd.
U.S. Appl. No. 12/713,928, filed Feb. 26, 2010, Kil-won Lee et al., Samsung Mobile Display Co., Ltd.
U.S. Appl. No. 12/714,137, filed Feb. 26, 2010, Byoung-keon Park et al., Samsung Mobile Display Co., Ltd.
European Extended Search Report issued on Mar. 4, 2014 in European Application No. 10154502.8.
Non-Final Office Action in U.S. Appl. No. 13/841,121 dated Sep. 30, 2014.

METHOD OF FORMING POLYCRYSTALLINE SILICON LAYER, THIN FILM TRANSISTOR, ORGANIC LIGHT EMITTING DIODE DISPLAY DEVICE HAVING THE SAME, AND METHODS OF FABRICATING THE SAME

CROSS-REFERENCE TO RELATED APPLICATION

This application claims the benefit of Korean Patent Application No. 10-2009-0109835, filed Nov. 13, 2009 in the Korean Intellectual Property Office, the disclosure of which is incorporated herein by reference.

BACKGROUND

1. Field

Aspects of the present invention relate to a method of forming a polycrystalline silicon layer, a thin film transistor, an organic light emitting diode (OLED) display device having the same, and methods of fabricating the same, and more particularly, to a method of crystallizing an amorphous silicon layer using a metal catalyst by scratching a buffer layer, the amorphous silicon layer or a capping layer in a linear pattern to control a metal silicide, and thus control crystal growth of a polycrystalline silicon layer.

2. Description of the Related Art

In general, polysilicon layers, which are used for semiconductor layers for thin film transistors (TFTs), have various advantages such as high electric field effect mobility, adaptation to high speed operational circuits, and realization of complementary metal-oxide semiconductor (CMOS) circuits. Transistors using such polysilicon layers are mainly used for active devices of active matrix liquid crystal displays (AMLCDs) and switching devices and driving devices of organic light emitting diode display devices (OLED display devices).

Methods of crystallizing an amorphous silicon layer into a polycrystalline silicon layer include solid phase crystallization (SPC), excimer laser crystallization (ELC), metal-induced crystallization (MIC), and metal-induced lateral crystallization (MILC). Presently, the methods of crystallizing an amorphous silicon layer using a metal are being widely studied because they enable the amorphous silicon layer to be crystallized within a shorter time at a lower temperature than SPC. The crystallization methods using a metal include MIC, MILC, and super grain silicon (SGS) crystallization. However, in these methods using the metal catalysts, it is difficult to control a seed formed of a metal silicide involved with forming a crystal grain, and device characteristics of the TFT can be degraded due to contamination caused by the metal catalyst.

SUMMARY

Aspects of the present invention provide a thin film transistor having a semiconductor layer whose characteristics are improved by scratching a buffer layer, an amorphous silicon layer or a capping layer disposed in a lower region of a metal catalyst during crystallization using the metal catalyst to control formation of a metal silicide, controlling a crystal grain of a polycrystalline silicon layer and reducing an amount of a metal catalyst present in a semiconductor layer, an OLED display device having the same, and methods of fabricating the same.

According to an aspect of the present invention, a method of forming a polycrystalline silicon layer includes: providing a substrate; forming a buffer layer on the substrate; forming an amorphous silicon layer on the buffer layer; forming a groove in the amorphous silicon layer; forming a capping layer on the amorphous silicon layer; forming a metal catalyst layer on the capping layer; and annealing the substrate and crystallizing the amorphous silicon layer into a polycrystalline silicon layer.

According to another aspect of the present invention, a thin film transistor and a method of fabricating the same are provided, the thin film transistor including: a substrate; a buffer layer disposed on the substrate; a semiconductor layer disposed on the buffer layer; a gate insulating layer disposed on an entire surface of the substrate; a gate electrode corresponding to the semiconductor layer; and source and drain electrodes insulated from the gate electrode and connected to the semiconductor layer. Here, a groove is formed on an upper surface of the semiconductor layer, and a metal silicide is disposed in the groove.

According to still another aspect of the present invention, an OLED display device having the thin film transistor and a method of fabricating the same are provided.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION

Reference will now be made in detail to the present embodiments of the present invention, examples of which are illustrated in the accompanying drawings, wherein like reference numerals refer to the like elements throughout. The embodiments are described below in order to explain the present invention by referring to the figures.

Here, it is to be understood that where it is stated that one film or layer is "formed on" or "disposed on" a second layer or film, the first layer or film may be formed or disposed directly on the second layer or film or there may be intervening layers or films between the first layer or film and the second layer or film. Further, as used herein, the term "formed on" is used with the same meaning as "located on" or "disposed on" and is not meant to be limiting regarding any particular fabrication process. Further, some of the elements that are not essential to the complete understanding of the invention are omitted for clarity.

Figure 1A:
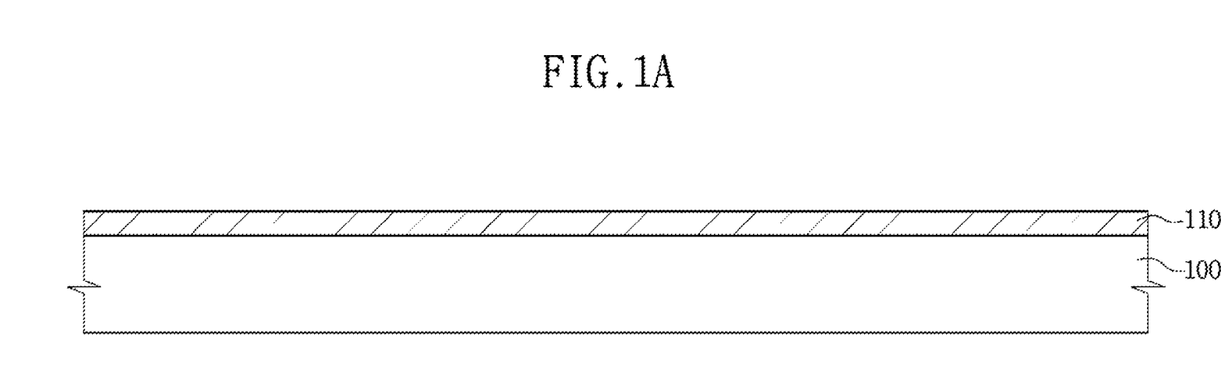
FIGS. 1A through 1E are views according to an exemplary embodiment of the present invention.

FIGS. 1A through 1E are views according to an exemplary embodiment of the present invention. Referring to FIG. 1A, a buffer layer 110 is formed on a substrate 100. The substrate 100 can be made of, for example, glass or plastic. The buffer layer 110 is formed by chemical vapor deposition (CVD) or physical vapor deposition (PVD) in a single layer or double layer structure using insulating layers, such as a silicon oxide layer and a silicon nitride layer. The buffer layer 110 may be formed in a double layer structure of a silicon nitride layer and a silicon oxide layer to facilitate diffusion of a metal catalyst.

Figure 1B:
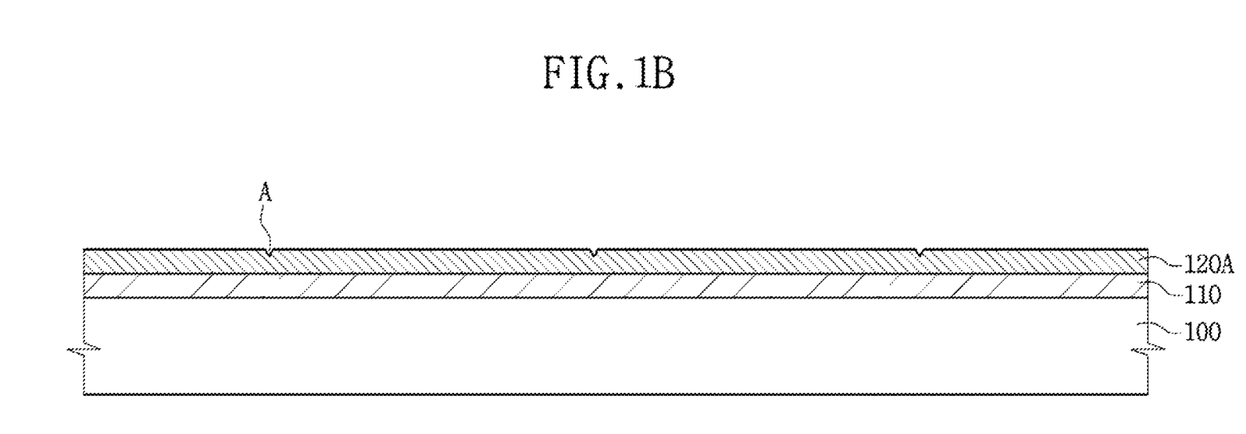

Referring to FIG. 1B, an amorphous silicon layer 120A is formed on the buffer layer 110 formed on the substrate 100. Here, one or more grooves A are formed by scratching the formed amorphous silicon layer 120A. The grooves A may be formed in a continuous line as shown, but the invention is not limited thereto. Referring to FIG. 1F, it can be found that the grooves A are formed in the amorphous silicon layer 120A. A crystal shape may be controlled according to the width and depth of the grooves A.

Figure 1C:
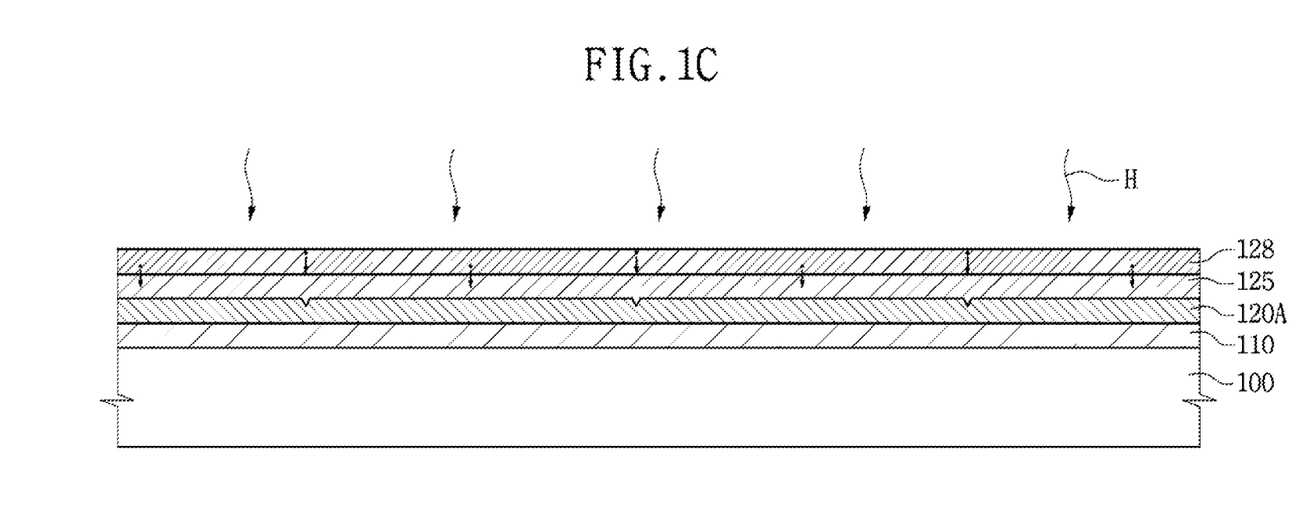

After forming the grooves A, referring to FIG. 1C, a capping layer 125 and a metal catalyst layer 128 are sequentially formed on the amorphous silicon layer 120A having the grooves A. As shown, the capping layer 125 is formed to a thickness of 10 to 2000 Å. When the thickness is less than 10 Å, it is difficult to prevent diffusion of a metal catalyst present in the capping layer 125 into the amorphous silicon layer 120A, and when the thickness is more than 2000 Å, it is difficult to crystallize the amorphous silicon layer 120A to be formed later into a polycrystalline silicon layer 120B because of a small amount of the metal catalyst diffused into the amorphous silicon layer 120A.

The metal catalyst layer 128 may be formed of a material selected from the group consisting of Nickel (Ni), Palladium (Pd), Silver (Ag), Gold (Au), Aluminum (Al), Tin (Sn), Antimony (Sb), Copper (Cu), Titanium (Ti), and Cadmium (Cd), and preferably, is made of Ni. Here, the metal catalyst layer 128 is formed on the capping layer 125 to have an areal density of $10^{11}$ to $10^{15}$ atoms/cm$^2$. When the areal density of the metal catalyst layer 128 is less than $10^{11}$ atoms/cm$^2$, it is difficult to crystallize the amorphous silicon layer 120A into the polycrystalline silicon layer 120B because an amount of a seed, which is a core of crystallization, is small. When the areal density of the metal catalyst layer 128 is more than $10^{15}$ atoms/cm$^2$, a crystal grain of the polycrystalline silicon layer 120B becomes smaller because of a large amount of the metal catalyst diffused into the amorphous silicon layer 120A, and an amount of a remaining metal catalyst is increased, thereby degrading characteristics of a semiconductor layer formed by patterning the polycrystalline silicon layer 120B.

Figure 1D:
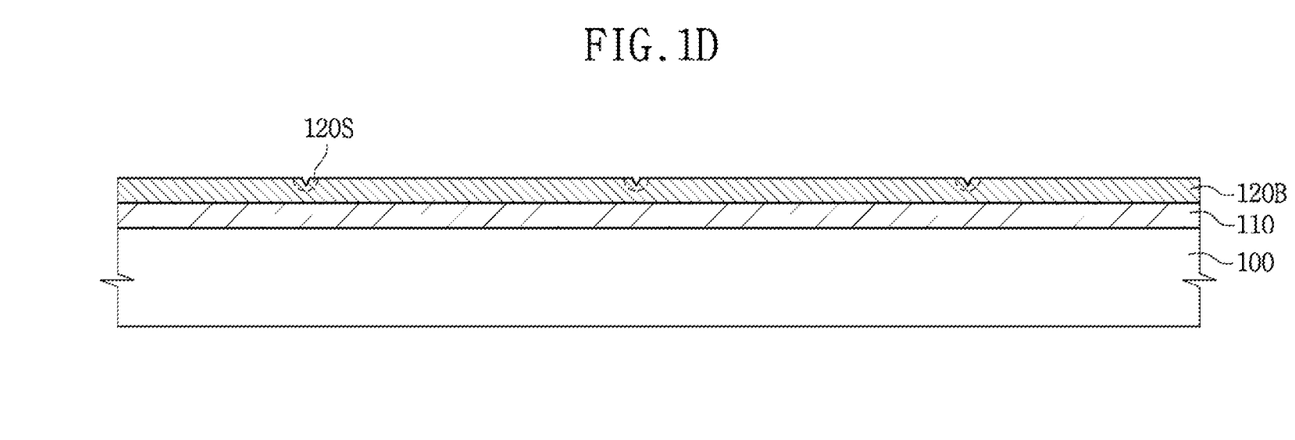
Figure 1E:
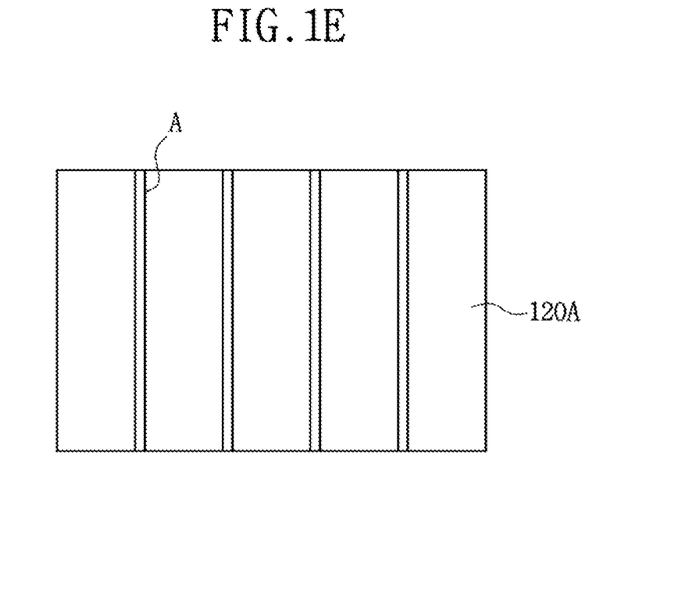
Figure 1F:
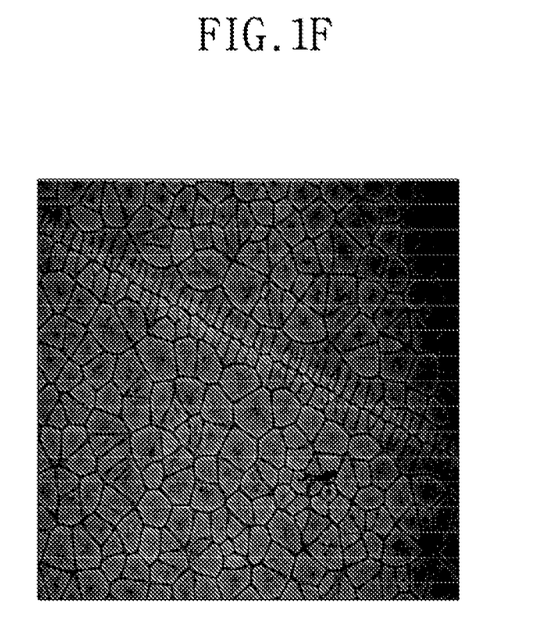
FIG. 1F is a photograph of a polycrystalline silicon layer crystallized in an exemplary embodiment of the present invention.

After forming the metal catalyst and capping layers 125, 128, the substrate 100 is annealed (H) to crystallize the amorphous silicon layer 120A into a polycrystalline silicon layer 120B of FIG. 1D using the metal catalyst. Here, the annealing (H) process is performed in the range of 200 to 900° C. for several seconds to hours to diffuse the metal catalyst A, which prevents deformation of the substrate 100 due to an excessive annealing process, and is preferable in aspects of production costs and yields. The annealing (H) process may be one of furnace, rapid thermal annealing, UV and laser processes.

Subsequently, referring to FIG. 1D, the crystallized polycrystalline silicon layer 120B was formed by the annealing (H) process, and the capping layer 125 and the metal catalyst layer 128 are removed from the substrate 100. As shown, the polycrystalline silicon layer 120B includes a seed region 120S under the grooves A. In the seed region 120S, a metal silicide formed by bonding the metal catalyst diffused from the metal catalyst layer 128 to the amorphous silicon layer 120A, as a seed, starts to be crystallized, and the seeds are collected in the grooves A to be disposed in a linear pattern like the grooves A.

It can be seen from FIG. 1F that the seeds are connected to each other and formed in a linear pattern, and uniform crystals are laterally grown from the seeds.

Thus, the linear-patterned seeds are formed by collecting the seeds in the grooves A formed by scratching. It can be seen that a location where the seed is formed can be controlled by simply scratching a surface of the amorphous silicon layer 120A, and thus the growth of the crystal may be controlled. Therefore, a semiconductor layer is selectively formed by controlling the seed to control crystallinity of the polycrystalline silicon layer 120B, so that a thin film transistor (TFT) having the semiconductor layer having an improved uniformity in crystallinity and a device having the same may be fabricated.

While, in the exemplary embodiment, the grooves A are formed in the amorphous silicon layer 120A and then crystallized, the grooves A may be formed on the buffer layer 110 or the capping layer 125 instead of the amorphous silicon layer 120A, thereby performing crystallization in the same manner as described above.

Figure 2A:
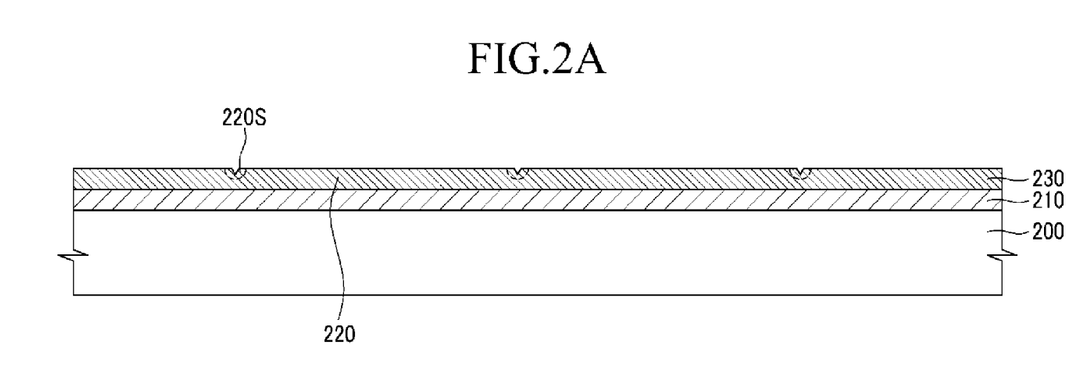
FIGS. 2A through 2C illustrate a thin film transistor according to another exemplary embodiment of the present invention.
Figure 2B:
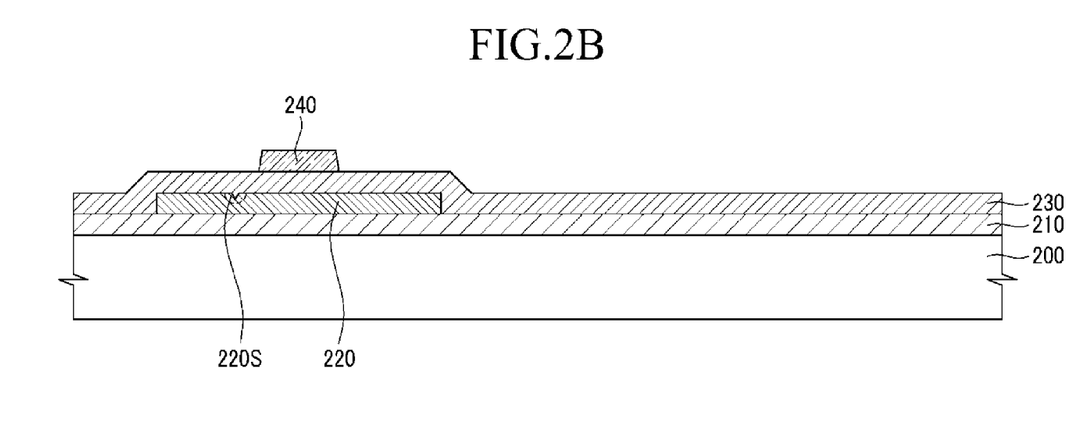
Figure 2C:
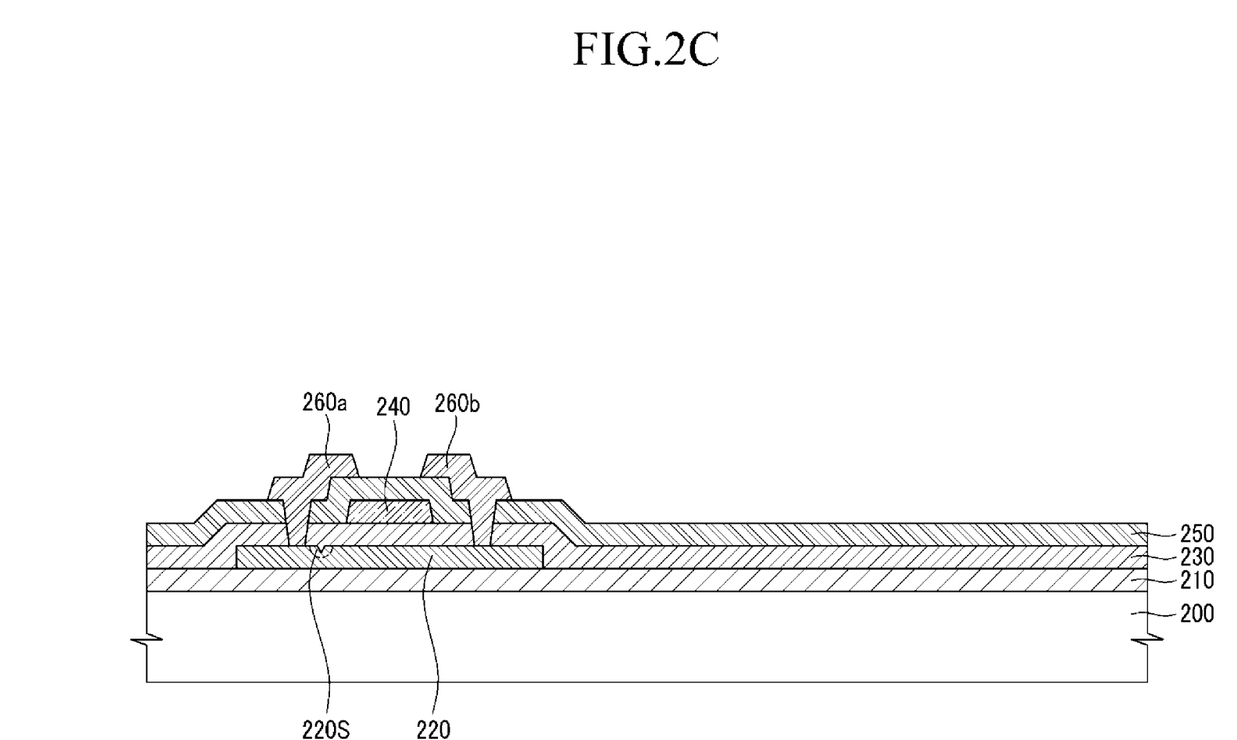

FIGS. 2A through 2C illustrate a TFT formed by the method of forming a polycrystalline silicon layer 220B described in an exemplary embodiment of the present invention. Hereinafter, since the polycrystalline silicon layer 220B is formed by the method of forming the polycrystalline silicon layer 120B described above in relation to FIGS. 1A through 1F, like descriptions will be omitted to avoid repetition.

Referring to FIG. 2A, a buffer layer 210 is formed on substrate 200, as described above with reference to FIG. 1A. Crystallization is performed to form the polycrystalline silicon layer 220B, and a seed (i.e., a metal silicide formed of a metal catalyst and a silicon layer), is formed under grooves A in the polycrystalline silicon layer 220B, thereby forming a seed region 220S. The seed region 220S is formed along the linear patterned grooves A. The crystal is laterally grown from the seed.

Referring to FIG. 2B, the crystallized polycrystalline silicon layer 220B is patterned, thereby forming a semiconductor layer 220. Here, since the seed region 220s is formed under the grooves A in the polycrystalline silicon layer 220B, the semiconductor layer 220 is patterned such that a groove is not formed in a channel region influencing characteristics of the semiconductor layer 220, and current flow of the semiconductor layer 220 becomes perpendicular to the groove A.

After forming the semiconductor layer 220, a gate insulating layer 230 is formed on the entire surface of the substrate 200 and covering the semiconductor layer 220. The gate insulating layer 230 may be formed of a silicon oxide layer, a silicon nitride layer or a double layer thereof.

Subsequently, a gate electrode 240 corresponding to the semiconductor layer 220 is formed on the gate insulating layer 230. The gate electrode 240 is formed of a metal layer (not shown) in a single layer structure of aluminum (Al) or an Al alloy such as aluminum-neodymium (Al—Nd) or a double layer structure in which an aluminum alloy is stacked on a chromium (Cr) or molybdenum (Mo) alloy through photolithography and etching.

Referring to FIG. 2C, an interlayer insulating layer 250 is formed on the entire surface of the substrate 200 covering the gate electrode 240 and the gate insulating layer 230. Source and drain electrodes 260a and 260b are formed insulated from the gate electrode 240 and electrically connected to the semiconductor layer 220. Thus, the TFT is completed.

Another exemplary embodiment of the present invention relates to an OLED display device having the TFT described in FIGS. 2A-2C, and thus like descriptions will be omitted to avoid repetition.

Figure 3A:
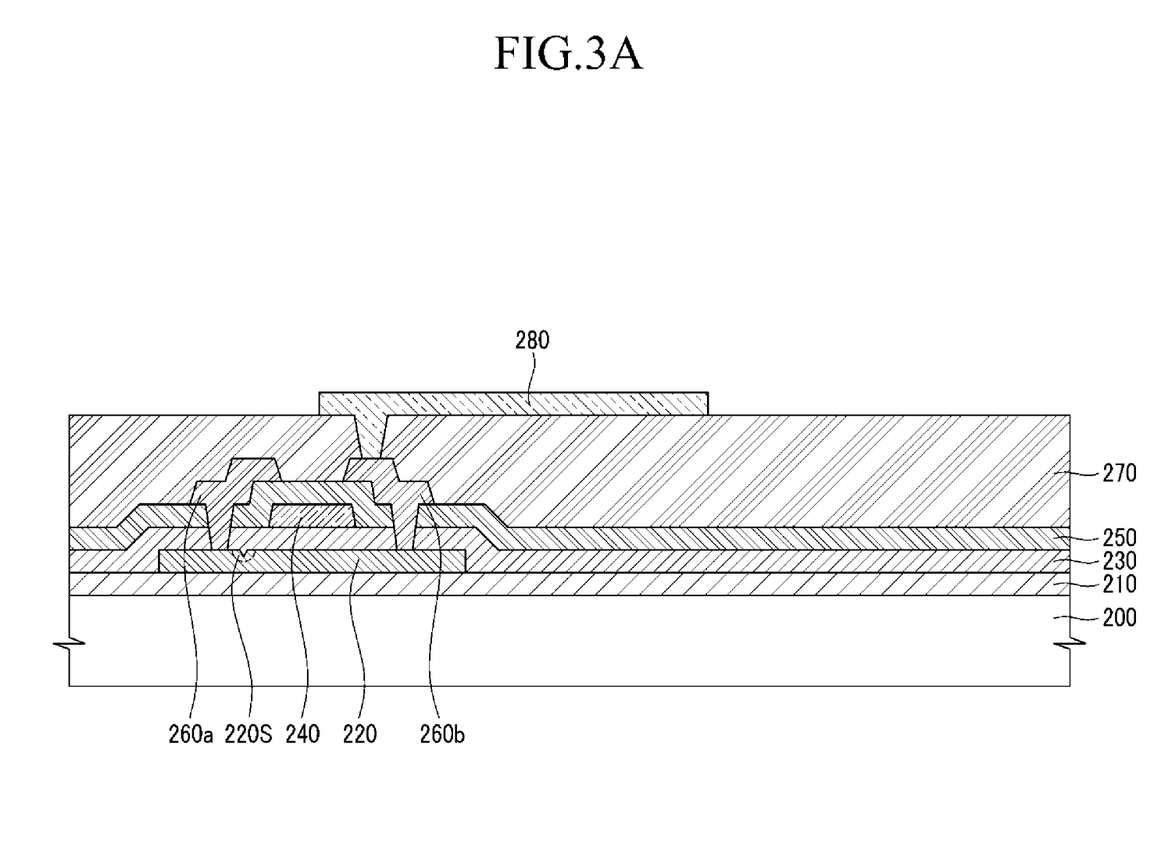
FIGS. 3A and 3B illustrate an OLED display device according to another exemplary embodiment of the present invention.
Figure 3B:
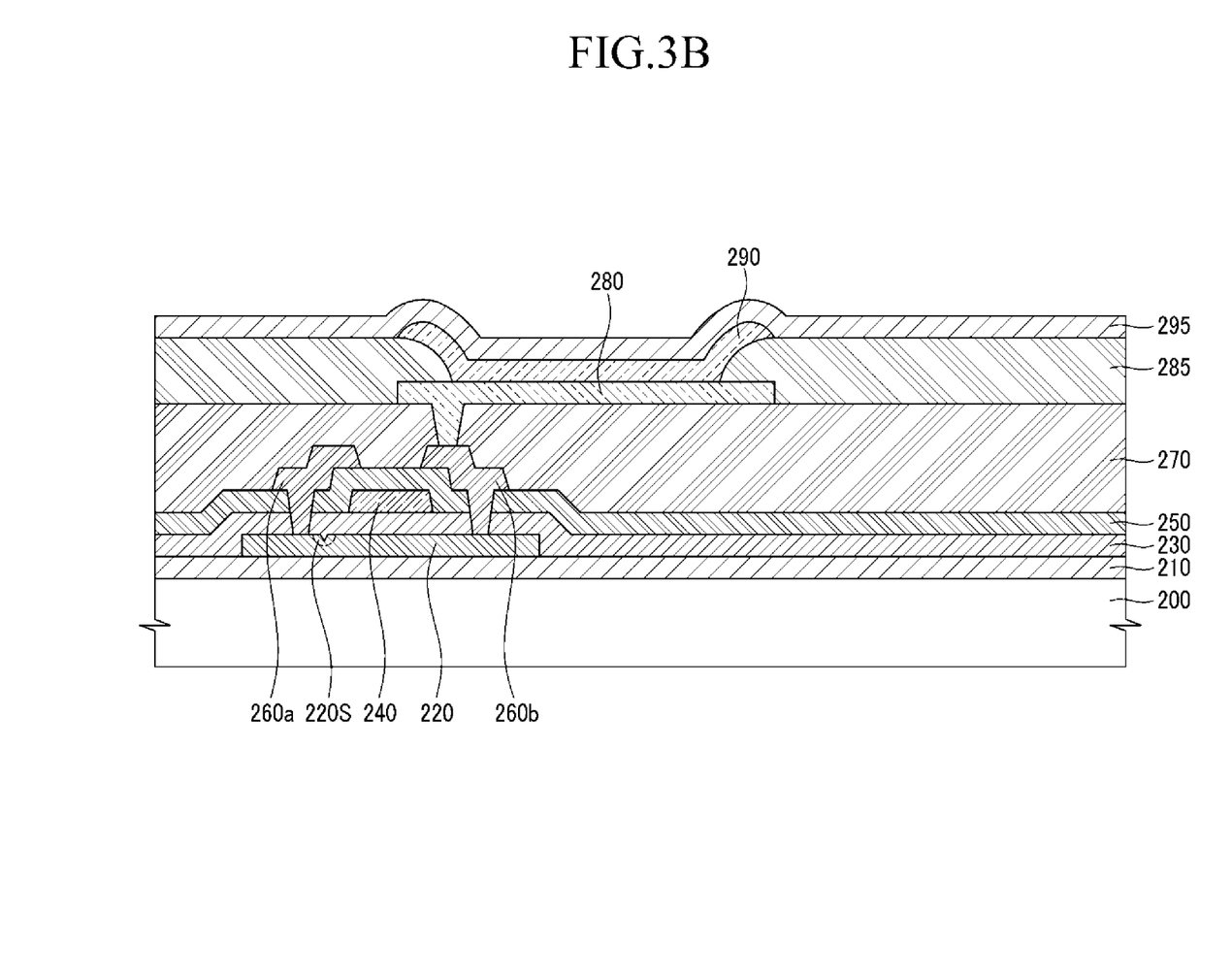

FIGS. 3A and 3B illustrate an OLED display device according to another exemplary embodiment of the present invention. Referring to FIG. 3A, an insulating layer 270 is formed on the entire surface of the substrate 200 and covering the TFT.

A first electrode 280 is formed on the insulating layer 270 and is electrically connected to one of source and drain electrodes 260a and 260b formed on interlayer insulating layer 250.

Referring to FIG. 3B, a pixel defining layer 285 exposing a part of the first electrode 280 and defining a pixel is formed on the insulating layer 270. An organic layer 290 having an organic emitting layer is formed on the exposed first electrode 280.

After forming the organic layer 290, a second electrode 295 is formed on the entire surface of the substrate 200 to cover the pixel defining layer 285 and the organic layer 290, and thus the OLED display device is completed.

Comparative Example

In a Comparative Example, a procedure of forming grooves in an amorphous silicon layer by scratching the amorphous silicon layer as noted in one of the exemplary embodiments of the present invention is omitted, while other procedures are the same as those described in the exemplary embodiments of the present invention. Thus, to avoid repetition, like descriptions will be omitted.

Table 1 shows data comparing characteristic distributions between the TFT according to an exemplary embodiment of the present invention and a TFT according to the Comparative Example in which SGS crystallization is performed without formation of grooves.

TABLE 1

| | Distribution (V) of Threshold Voltage (Vth) | Distribution of Electron Mobility ($cm^2/V \cdot sec$) | Distribution of S Factor | Distribution of On-Current ($\mu A/\mu m$) |
|---|---|---|---|---|
| Exemplary Embodiment | 0.09 | 1.03 | 0.04 | 0.15 |
| Comparative Example | 0.21 | 7.02 | 0.06 | 0.82 |

Referring to Table 1, in the Exemplary Embodiment which the TFT is fabricated by forming the grooves in an upper portion of the amorphous silicon layer to control a seed through crystallization according to an aspect of the present invention. In the Exemplary Embodiment the threshold voltage was 0.09 V, while in the Comparative Example, the threshold voltage was 0.21 V. Therefore, it can be seen that because the distribution of the threshold voltage of the TFT according to the Exemplary Embodiment is smaller, the characteristics of the TFT according to the Exemplary Embodiment are more uniform. In addition, the distributions of the electron mobility were 1.03 $cm^2/V \cdot sec$ for the Exemplary Embodiment, and 7.02 $cm^2/V \cdot sec$ for the Comparative Example. Accordingly, it can be seen that since the distribution value of the Exemplary Embodiment is lower, the characteristics of the TFT according to the Exemplary Embodiment are more uniform. The distribution values of the S factor were 0.04 for the Exemplary Embodiment, and 0.06 for the Comparative Example, which indicates that the Exemplary Embodiment exhibits a better S factor characteristic. In addition, the on-current distribution values were 0.15 $\mu A/\mu m$ for the Exemplary Embodiment, and 0.82 $\mu A/\mu m$ for the Comparative Example, which indicates that the Exemplary Embodiment exhibits a better on-current characteristic.

Thus, in the TFT formed according to an aspect of the present invention, a seed and a crystal grain can be controlled during crystallization of an amorphous silicon layer. In other words, because the semiconductor layer is selectively formed according to the crystal grain, the TFT formed according to the exemplary embodiment of the present invention may be improved in uniformity of its characteristics. In formation of a device having a plurality of TFTs, when TFTs having uniform characteristics are provided, a device having improved characteristics such as brightness may be produced.

In the Exemplary Embodiments of the present invention, the amorphous silicon layer is scratched to form the linear-patterned grooves and then crystallized, but the aspects of the present invention are not limited thereto. Alternatively, even when the grooves are formed in a buffer or capping layer instead of the amorphous silicon layer, and then the amorphous silicon layer is crystallized, the same result may be obtained as described above.

In the exemplary embodiments, after the capping layer is formed on the amorphous silicon layer and the metal catalyst layer is formed, the crystallization is performed, but the aspects of the present invention are not limited thereto. Without the capping layer on the amorphous silicon layer, the metal catalyst layer may be directly formed, and then the crystallization may be performed.

Moreover, in the exemplary embodiments of the present invention, the TFT and the OLED display device are fabricated in a top-gate structure, but the aspects of the present invention are not limited thereto. Therefore, they may be fabricated in a bottom-gate structure.

A buffer layer, an amorphous silicon layer or a capping layer disposed in a lower region of a metal catalyst is scratched during crystallization using the metal catalyst to control formation of a metal silicide and thus control a crystal grain of a polycrystalline silicon layer and reduce an amount of the metal catalyst present in a semiconductor layer, so that a thin film transistor having a semiconductor layer whose characteristics are improved, an OLED display device having the same, and methods of fabricating the same may be provided.

Although the aspects of the present invention has been described with reference to predetermined exemplary embodiments thereof, it will be understood by those skilled in the art that a variety of modifications and variations may be made to the aspects of the present invention without departing from the spirit or scope of the present invention defined in the appended claims and their equivalents.

What is claimed is:

1. A thin film transistor (TFT), comprising:
  a substrate;
  a buffer layer disposed on the substrate;
  a semiconductor layer disposed on the buffer layer and comprising a channel region and grooves formed in a linear pattern on an upper surface of the semiconductor layer;
  a gate insulating layer disposed on the semiconductor layer;
  a gate electrode corresponding to the semiconductor layer; and a source electrode and a drain electrode insulated from the gate electrode and connected to the semiconductor layer,
wherein:
a metal silicide is disposed in a seed region under the grooves;
an interval between the grooves is set so as to control a crystal grain size of a polycrystalline layer patterned to form the semiconductor layer; and
the grooves are disposed in a region of the semiconductor layer except the channel region.

2. The TFT according to claim 1, wherein the metal silicide is continuously disposed along the groove.

3. The TFT according to claim 1, wherein the metal silicide is formed of a material selected from the group consisting of Nickel (Ni), Palladium (Pd), Silver (Ag), Gold (Au), Aluminum (Al), Tin (Sn), Antimony (Sb), Copper (Cu), Titanium (Ti), and Cadmium (Cd).

4. The TFT according to claim 1, wherein the grooves are formed perpendicular to a current flow of the semiconductor layer.

5. An organic light emitting diode (OLED) display device, comprising:
a substrate;
a buffer layer disposed on the substrate;
a semiconductor layer disposed on the buffer layer and comprising a channel region and grooves formed in a linear pattern on an upper surface of the semiconductor layer;
a gate insulating layer disposed on the semiconductor layer;
a gate electrode corresponding to the semiconductor layer;
a source electrode and a drain electrode insulated from the gate electrode and connected to the semiconductor layer;
an insulating layer disposed on the substrate;
a first electrode electrically connected to one of the source electrode and the drain electrode;
an organic layer disposed on the first electrode; and
a second electrode disposed on the organic layer,
wherein:
a metal silicide is disposed in a seed region under the grooves;
an interval between the grooves is set so as to control a crystal grain size of a polycrystalline layer patterned to form the semiconductor layer; and
the grooves are disposed in a region of the semiconductor layer except the channel region.

6. The device according to claim 5, wherein the metal silicide is continuously disposed along the groove.

7. The device according to claim 5, wherein the metal silicide is formed of a material selected from the group consisting of Nickel (Ni), Palladium (Pd), Silver (Ag), Gold (Au), Aluminum (Al), Tin (Sn), Antimony (Sb), Copper (Cu), Titanium (Ti), and Cadmium (Cd).

8. The device according to claim 5, wherein the grooves are formed perpendicular to current flow of the semiconductor layer.

* * * * *